Sept. 22, 1953 WEN YUAN PAN 2,653,228

ULTRAHIGH-FREQUENCY CONVERTER

Filed Aug. 16, 1951

INVENTOR
WEN YUAN PAN
BY H. L. Newton
ATTORNEY

Patented Sept. 22, 1953 2,653,228

UNITED STATES PATENT OFFICE 2,653,228

ULTRAHIGH-FREQUENCY CONVERTER

Wen Yuan Pan, Collingswood, N. J., assignor to Radio Corporation of America, a corporation of Delaware Application August 16, 1951, Serial No. 242,161

8 Claims. (Cl. 250—20)

Figures 1, 2, 3:
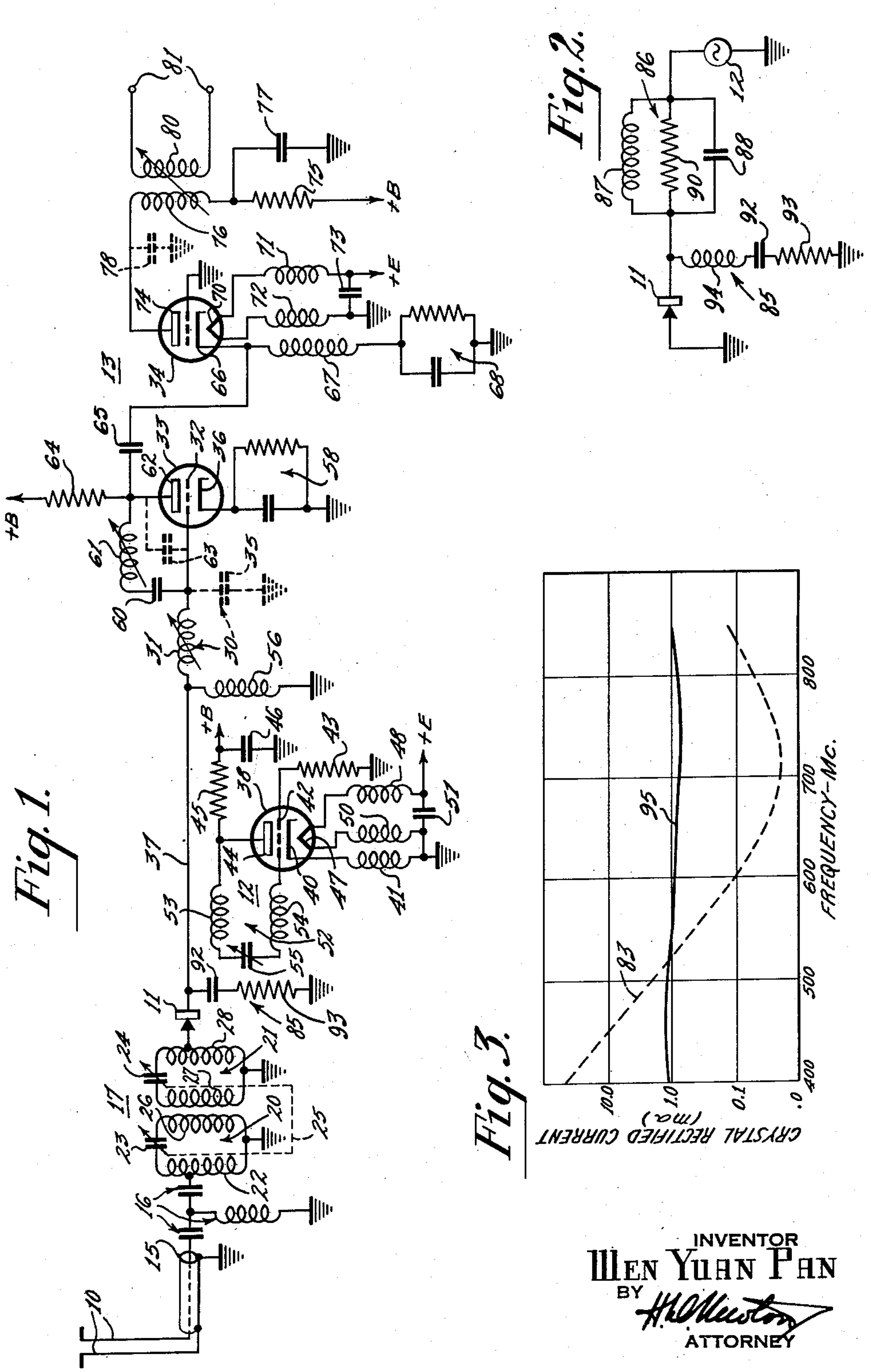

This invention relates generally to frequency converters, and particularly relates to a frequency conversion system including a mixer and an oscillation generator suitable for use in the ultra high frequency (U. H. F.) spectrum.

A conventional frequency converter for a U. H. F. band includes a crystal mixer and an oscillation generator. The mixer has an input circuit tunable over the desired band and an output circuit tuned to a fixed intermediate frequency. The oscillatory wave energy is preferably injected between the mixer and its output circuit to reduce oscillator radiation. It has been found that several important performance characteristics of a U. H. F. converter depend upon the amount of oscillatory energy impressed on the crystal mixer. These performance characteristics include the undesired oscillator radiation, spurious responses which are caused by harmonics generated in the mixer during the mixing process and the noise factor.

The undesirable oscillator radiation through the antenna terminals of a U. H. F. converter is determined by the intermediate frequency, the band width of the radio-frequency input circuit of the mixer and by the amount of the oscillatory energy impressed on the mixer. It will be obvious that as the oscillator radiation becomes smaller, the smaller the oscillatory energy impressed on the mixer. On the other hand, the oscillatory energy impressed on the mixer should be high in order to reduce the conversion loss, thus increasing the mixer efficiency. Accordingly, the oscillatory energy impressed on the mixer should have an optimum value which is of the order of 500 microwatts provided the mixer is a silicon crystal such as the 1N21B type or a germanium crystal of the 1N72 or CK–710 type. If the crystal is excited with either too high or too low amplitude oscillatory energy, the converter is also more susceptible to spurious responses in the presence of interfering signals.

Furthermore, wide fluctuations of the oscillatory energy impressed on the mixer may cause variations of the impedance match between the crystal and its input and output circuits. Such variations may introduce mismatch between the crystal mixer and its radio frequency input circuit as well as between the crystal and its intermediate frequency output circuit. It will accordingly be obvious that the crystal should be excited by the optimum value of the oscillatory energy and that this value should remain substantially constant over the entire tuning range. If the U. H. F. converter is, for example, designed to cover a television band such as that now tentatively allocated in the frequency range from 470 to 890 mc., the oscillatory energy injected in the conventional manner on the mixer of a frequency converter may vary as much as 1000 to 1.

It is accordingly the principal object of the present invention to provide a U. H. F. converter system wherein means are provided to maintain the oscillatory energy impressed on the mixer of the system substantially constant throughout the tuning range of the oscillator.

A further object of the invention is to provide for effectively shunting the local oscillator of the U. H. F. converter system by an oscillator wave path having a low impedance which varies within very narrow limits over the oscillator tuning range and which controls the oscillatory wave energy impressed on the mixer of the converter system so as to maintain it substantially constant.

A U. H. F. converter system may comprise a crystal mixer having a resonant input circuit connected to one of its electrodes. The resonant input circuit is tunable within a predetermined portion of the U. H. F. spectrum to receive a desired modulated carrier wave. A resonant output circuit tuned to a predetermined intermediate frequency is connected to the output electrode of the mixer. A local oscillator is provided for injecting oscillatory energy preferably upon the output electrode of the mixer to reduce oscillator radiation through the antenna terminals. The local oscillator is tunable within another portion of the U. H. F. spectrum.

In accordance with the present invention, means are provided for maintaining the oscillatory wave energy impressed on the crystal mixer substantially constant throughout the tuning range of the local oscillator. This means comprises a capacitor and a resistor connected serially between the output electrode of the mixer and ground. Accordingly, the capacitor and resistor effectively shunt the crystal mixer. The capacitor and resistor have a combined impedance which varies within very narrow limits over the oscillator tuning range. The leads which connect the capacitor and resistor between the mixer electrode and ground represent inductance which is added to the impedance of the shunt path provided by the resistor and capacitor. Thus if the shunt path would include only a capacitor, its capacitance would be series resonant with the inductance of the lead so that within a certain portion of the oscillator range the oscillator would be effectively short-circuited.

A return path for the direct current flowing through the crystal mixer may include a first inductor forming part of the mixer input circuit and connected between the mixer and ground. A second inductor which functions as a choke may be connected between the mixer output electrode and ground to complete the direct current return path.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a circuit diagram of a U. H. F. converter embodying the present invention;

Figure 2 is an equivalent circuit diagram of the mixer and oscillator of the converter of Figure 1; and Figure 3 is a graph illustrating the rectified current flowing through the crystal mixer of the invention and through that of a conventional U. H. F. converter as a function of frequency.

Referring now to the drawing there is illustrated in Figure 1 a U. H. F. converter comprising an antenna 10, a crystal mixer 11, a local oscillator 12 and an intermediate frequency amplifier stage 13 as is conventional. The mixer 11 preferably consists of a crystal rectifier such as a silicon crystal rectifier of the 1N21B type or a germanium crystal rectifier of the 1N72 or CK-710 type. The crystal rectifier or mixer 11 has two electrodes as illustrated; one being in ohmic contact and one in rectifying contact with the crystal. However, it is immaterial to which electrode the input circuit is connected.

The input circuit of the mixer 11 includes the antenna 10 which may, for example, be a dipole and which is connected to a transmission line 15 such as a coaxial line having its outer conductor grounded as shown. A high pass filter 16 is connected between the transmission line 15 and the radio-frequency input circuit 17. The high pass filter 16 may be a constant K filter and comprises two capacitors connected in series and an inductor connected between the junction point of the capacitors and ground. The high pass filter 16 may, for example, reject the very high frequency television channels 2 to 13.

The radio-frequency input circuit 17 may include two series resonant tunable circuits 20 and 21. Resonant circuit 20 includes an inductor 22 having an intermediate point connected to the high pass filter 16 to match the impedance of the filter 16 to that of the resonant circuit 20. The lower terminal of inductor 22 may be grounded as shown. The series resonant circuits 20 and 21 each include a capacitor 23 and 24 which may be varied in unison as indicated at 25. The two series resonant circuits 20, 21 are magnetically coupled through their respective inductors 26 and 27. The inductor 28 of the series resonant circuit 21 has an intermediate point connected to one of the electrodes of the crystal mixer 11 which may be called the input electrode, thereby to match the impedance of the input circuit 17 to that of the mixer 11. The lower terminal of inductor 28 is grounded as shown.

A pair of series resonant filter structures providing a double tuned filter of the type illustrated at 17 in Figure 1 has been disclosed and claimed in applicant's copending application, Serial No. 230,043, filed on June 5, 1951, and assigned to the assignee of this application. However, it is to be understood that any other suitable filter structure may be used instead which provides a tunable pass band for U. H. F. signals.

The crystal mixer 11 includes an output circuit 30 tuned to a fixed or predetermined intermediate frequency. The output circuit 30 includes an inductor 31 connected in series between the second or output electrode of mixer 11 and the control grid 32 of amplifier tube 33, which may be a triode as shown. The amplifier tube 33 functions as the driver stage for a second amplifier stage 34 which is a grounded grid amplifier. The output circuit 30 for the mixer further includes the capacitor 35 which represents the interelectrode capacitance between control grid 32 and cathode 36 of driver stage 33. The fixed tuned resonant output circuit 30 accordingly is a series resonant circuit, the resonant frequency of which may be adjusted by adjustment of inductor 31 as indicated.

A lead or conductor 37 is provided between mixer 11 and inductor 31. This conductor 37 provides inductance and is utilized for picking up an oscillatory wave which is developed by the oscillation generator 12. The oscillation generator 12 may be of any type suitable for developing a U. H. F. wave. Preferably, however, the oscillator is of the type disclosed and claimed in applicant's copending application filed on May 29, 1951, Serial No. 228,891, entitled "Tunable Circuit Structure" and assigned to the assignee of this application.

The oscillation generator 12 includes an amplifier tube 38 which may be a triode as shown. The cathode 40 is grounded through inductor 41, the control grid 42 is grounded through grid leak resistor 43 and the anode 44 is supplied with a suitable anode voltage indicated at +B through dropping resistor 45 which may be bypassed to ground through bypass capacitor 46. The filament 47 is supplied with a suitable voltage indicated at +E through inductors 48 and 50. Inductor 50 may be grounded and both inductors may be bypassed to ground through bypass capacitor 51.

The oscillation generator 12 comprises as its frequency determining circuit a series resonant circuit 52 including inductors 53, 54 and a capacitor 55 connected in series between anode 44 and control grid 42. The resonant frequency of series resonant circuit 52 may be varied by varying capacitor 55. In this manner, the oscillation generator may be tuned through a predetermined U. H. F. band. As explained in the Pan application above referred to, the series resonant circuit 52 may consist of a parallel wire transmission line having its open end short-circuited by a variable capacitor.

The unmodulated carrier wave developed by oscillation generator 12 is now impressed on the conductor or lead 37. This is effected by disposing the oscillator 12 or its series resonant circuit 52 is proximity to the conductor 37 so that the oscillatory wave radiated by the series resonant circuit 52 is intercepted by the conductor 37. It is, of course, to be understood that the oscillatory wave may be impressed in any other suitable manner on the output electrode of crystal mixer 11 thereby to reduce oscillator radiation through the antenna 10.

An inductor 56 is provided between lead 37 and ground and functions as a choke for the oscillator wave. The inductor 56 provides a return path for the direct current flowing through crystal mixer 11. The direct current flows through lead 37, inductor 56 and ground and back through inductor 28 and its tap through crystal 11.

The intermediate frequency amplifier stage 13 which may be conventional, will now be described. The cathode 36 of the driver stage 33 is grounded through a grid bias network 58. A blocking capacitor 60 and an inductor 61 are connected in series between the control grid 32 and the anode 62 of the driver stage 33. The blocking capacitor 60 has a negligible impedance at the intermediate frequency. The inductor 61 neutralizes the capacitor 63 which indicates the capacitance between anode 62 and control grid 32. The anode 62 is connected to the anode voltage supply +B through resistor 64 across which the output signal is developed.

The output signal derived across anode resistor 64 is impressed through coupling capacitor 65 on the cathode 66 of the grounded grid amplifier 34. Cathode 66 is grounded through inductor 67 and bias network 68 connected in series. The cathode filament 70 is connected to a suitable source of filament voltage indicated at +E through inductors 71 and 72. Inductor 72 may be grounded as shown and both inductors may be bypassed through bypass capacitor 73.

The anode 74 of the grounded grid amplifier stage 34 is connected to +B through resistor 75 and inductor 76. Resistor 75 may be bypassed to ground through bypass capacitor 77. Inductor 76 is tuned by a capacitor 78 which indicates the capacitance between anode 74 and the control grid of the grounded grid amplifier 34. Inductor 80 is coupled to inductor 76 and the amplified intermediate frequency signal may be obtained from output terminals 81. The intermediate frequency amplifier stage 13 operates in a conventional manner and it is believed that its operation need not be described in detail here.

Referring now to Figure 3, there is illustrated curve 83 in dotted lines which indicates the rectified current in milliamperes (ma.) flowing through crystal rectifier 11 in response to the impressed oscillatory wave as a function of frequency. Curve 83 indicates the operation of the converter of Figure 1 as described so far, that is, without equalizing the oscillatory energy in accordance with the present invention. It will be seen that the rectified current of the crystal mixer 11 varies over a range of approximately 1000 to 1 (the rectified crystal current is plotted on a logarithmic scale). As explained hereinbefore, the oscillatory energy impressed on crystal mixer 11, which is a function of the rectified crystal current, should be maintained substantially constant over the tuning range of the oscillator. Obviously, curve 83 shows that the oscillatory energy is not constant.

In accordance with the present invention, a shunt path 85 is provided as shown by Figure 1 between the output electrode of crystal mixer 11 and ground. This path 85 effectively shunts the crystal mixer as shown more clearly in Figure 2. In the equivalent circuit of Figure 2, the input electrode of crystal mixer 11 has been shown grounded. Its output electrode is grounded through the oscillation generator 12 and the coupling circuit 86 including inductor 87, capacitor 88 and resistor 90 connected in parallel. The parallel resonant circuit 87, 88 represents the inductive and capacitive coupling between the oscillation generator 12 and conductor 37 while the resistor 90 indicates the coupling resistance. Accordingly, the path 85 also shunts the equivalent coupling circuit 86 and the oscillator 12.

In accordance with the present invention, the shunt path 85 includes a capacitor 92 and a resistor 93 connected in series between lead 37 and ground. As illustrated in Figure 2, an inductor 94 is furthermore connected in series with capacitor 92 and resistor 93. The inductor 94 represents the inductance of the leads which connect capacitor 92 and resistor 93 between conductor 37 and ground.

By way of example, the resistance of resistor 93 may be between 27 and 33 ohms and the capacitance of capacitor 92 may be between 10 and 12 micromicrofarads. The combined impedance of capacitor 92, resistor 93 and inductor 94 may be of the order of 30 to 40 ohms and varies over a range of approximately 1.5 to 1 over the U. H. F. oscillator tuning range between approximately 400 and 800 mc. The solid curve 95 of Figure 3 indicates the rectified crystal current as a function of frequency when the shunt path 85 of the invention is provided. The curve 95 may be adjusted up or down by an adjustment of the capacitance of capacitor 92 or by adjusting the coupling between the series resonant circuit 52 of the oscillator 12 and conductor 37.

The impedance of the shunt path 85 is of the order of 30 to 40 ohms. This impedance is small compared to the impedance which mixer 11 presents to the oscillatory wave and which is of the order of 300 to 400 ohms. The impedance of shunt path 85 is also small compared to the impedance of driver tube 33, which may be of the order of 1000 ohms. The impedance of inductor 56 is also high to the oscillatory wave. Accordingly, the impedance of the shunt path 85 determines the oscillatory energy impressed on the mixer 11 and maintains this energy substantially constant over the tuning range of the oscillator.

The resistor 93 prevents the impedance of the shunt path from becoming zero at the frequency where inductor 94 and capacitor 92 are series resonant. This series resonance may occur within the oscillator tuning range.

The crystal mixer 11 presents an impedance of approximately 400 ohms to the radio frequency input circuit 17. This impedance is high compared to the impedance of the shunt path 85 so that the amount of mismatch between the input circuit 17 and the crystal 11 is small. On the other hand, at the intermediate frequency the impedance of the shunt path 85 is equivalent to a parallel RC circuit having a shunt resistance of the order of 1400 ohms. This equivalent parallel RC circuit is shunted across the crystal mixer 11 for the intermediate frequency currents. Since the impedance of the crystal mixer 11 to intermediate frequency currents is approximately 200 ohms, the shunt path 85 introduces negligible effect on the matching between the crystal rectifier 11 and its intermediate frequency output circuit 30.

There has thus been disclosed a U. H. F. converter wherein the oscillatory energy impressed on a crystal mixer is maintained substantially constant throughout the oscillator tuning range. Hence, the optimum oscillatory energy may be impressed on the crystal mixer to improve the noise factor, reduce oscillator radiation and reduce spurious responses. This is effected by shunting the crystal mixer with a series network consisting of a resistor and a capacitor. The converter of the invention does not require specially constructed elements such as capacitors having substantially no inductance and, therefore, is very inexpensive in production.

What is claimed is:

1. A U. H. F. converter comprising a crystal mixer having two electrodes, a resonant input circuit tunable within a predetermined portion of the U. H. F. spectrum to receive a desired modulated carrier wave, said input circuit being connected between one of said electrodes and a point of substantially fixed potential, an oscillation generator tunable within another portion of said U. H. F. spectrum, a resonant output circuit tuned to a predetermined fixed frequency and connected effectively between the other one of said electrodes and said point of fixed potential, a conductor providing inductance connected between said other one of said electrodes and said output circuit, means coupling said oscillation generator to said conductor to impress an oscillatory wave thereon, and means for maintaining the oscillatory wave energy impressed on said crystal mixer substantially constant throughout the tuning range of said oscillation generator and comprising a capacitor and a resistor connected in series between said other one of said electrodes and said point of fixed potential.

2. A U. H. F. converter comprising a crystal mixer having two electrodes, a resonant input circuit tunable within a predetermined portion of the U. H. F. spectrum to receive a desired modulated carrier wave, said input circuit being connected between one of said electrodes and a point of substantially fixed potential, an oscillation generator tunable within another portion of said U. H. F. spectrum, a resonant output circuit tuned to a predetermined intermediate frequency and connected effectively between the other one of said electrodes and said point of fixed potential, a conductor providing inductance connected between said other one of said electrodes and said output circuit, said oscillation generator being disposed adjacent to said conductor to impress an oscillatory wave thereon, and means for maintaining the oscillatory wave energy impressed on said crystal mixer substantially constant throughout the tuning range of said oscillation generator and comprising a capacitor, a resistor and an inductive lead connected in series between said other one of said electrodes and said point of fixed potential.

3. A U. H. F. converter comprising a crystal mixer having a first and a second electrode, a resonant input circuit tunable over a first portion of the U. H. F. spectrum to receive a desired modulated carrier wave, said input circuit being connected between said first electrode and a point of substantially fixed potential, a resonant output circuit tuned to a predetermined fixed frequency and connected effectively between said second electrode and said point of fixed potential, a conductor providing inductance connected between said second electrode and said output circuit, means for impressing an unmodulated carrier wave on said conductor, said unmodulated carrier wave having a frequency variable within a second predetermined portion of said U. H. F. spectrum, and a capacitor and a resistor connected in series between said second electrode and said point of fixed potential, whereby the combined impedance of said capacitor and resistor varies within narrow limits over said second predetermined U. H. F. portion and effectively shunts the unmodulated carrier wave energy impressed on said crystal mixer to equalize said energy.

4. A U. H. F. converter comprising a crystal mixer having a first and a second electrode, a resonant input circuit tunable over a first portion of the U. H. F. spectrum to receive a desired modulated carrier wave, said input circuit being connected between said first electrode and a point of substantially fixed potential, a resonant output circuit tuned to a predetermined intermediate frequency and connected effectively between said second electrode and said point of fixed potential, means for impressing an unmodulated carrier wave on the second electrode of said crystal mixer said unmodulated carrier wave having a frequency variable within a second predetermined portion of said U. H. F. spectrum, a capacitor, a resistor and at least one lead connected in series between said second electrode and said point of fixed potential, said lead providing inductance, whereby the combined impedance of said capacitor, resistor and lead varies within narrow limits over said second predetermined U. H. F. portion and effectively shunts the unmodulated carrier wave energy impressed on said crystal mixer to equalize said energy, said combined impedance being small compared to the impedance which said crystal mixer presents to said unmodulated carrier wave.

5. A U. H. F. converter comprising a crystal mixer having a first and a second electrode, a resonant input circuit tunable over a first portion of the U. H. F. spectrum to receive a desired modulated carrier wave, said input circuit being connected between said first electrode and a point of substantially fixed potential, a resonant output circuit tuned to a predetermined intermediate frequency and connected effectively between said second electrode and said point of fixed potential, a conductor providing inductance connected between said second electrode and said output circuit, an oscillation generator disposed adjacent to said conductor for impressing an unmodulated carrier wave thereon, said oscillation generator developing a wave having a frequency variable within a second predetermined portion of said U. H. F. spectrum, a capacitor, a resistor and at least one lead connected in series between said second electrode and said point of fixed potential, said lead providing inductance, whereby the combined impedance of said capacitor, resistor and lead varies within narrow limits over said second predetermined U. H. F. portion and effectively shunts the unmodulated carrier wave energy impressed on said crystal mixer to equalize said energy.

6. A U. H. F. converter comprising a crystal mixer having a first and a second electrode, a resonant input circuit tunable over a first portion of the U. H. F. spectrum to receive a desired modulated carrier wave, said input circuit being connected between said first electrode and a point of substantially fixed potential, a resonant output circuit tuned to a predetermined intermediate frequency and connected effectively between said second electrode and said point of fixed potential, means for impressing an unmodulated carrier wave on the second electrode of said crystal mixer, said unmodulated carrier wave having a frequency variable within a second predetermined portion of said U. H. F. spectrum, a capacitor and a resistor connected in series between said second electrode and said point of fixed potential, whereby the combined impedance of said capacitor and resistor varies within narrow limits over said second predetermined U. H. F. portion and effectively shunts the unmodulated carrier wave energy impressed on said conductor to equalize said energy, said input circuit including a first inductor directly connected between said first electrode and said point of fixed potential, and a second inductor connected between said conductor and said point of fixed potential, said inductors providing a return path for the direct current flowing through said crystal mixer.

7. A U. H. F. converter comprising a crystal mixer having a first and a second electrode, a resonant input circuit tunable over a first portion of the U. H. F. spectrum to receive a desired modulated carrier wave, said input circuit being connected between said first electrode and a point of substantially fixed potential, a resonant output circuit tuned to a predetermined intermediate frequency and connected effectively between said second electrode and said point of fixed potential, a conductor providing inductance connected between said second electrode and said output circuit, means for impressing an unmodulated carrier wave on said conductor, said unmodulated carrier wave having a frequency variable within a second predetermined portion of said U. H. F. spectrum, a capacitor, a resistor and at least one lead connected in series between said second electrode and said point of fixed potential, said lead providing inductance, whereby the combined impedance of said capacitor, resistor and lead varies within narrow limits over said second predetermined U. H. F. portion and effectively shunts the unmodulated carrier wave energy impressed on said conductor to equalize said energy, said input circuit including a first inductor directly connected between said first electrode and said point of fixed potential, and a second inductor connected between said conductor and said point of fixed potential, said inductors providing a return path for the direct current flowing through said crystal mixer.

8. A U. H. F. converter comprising a crystal mixer having a first and a second electrode, a resonant input circuit tunable over a first portion of the U. H. F. spectrum to receive a desired modulated carrier wave, said input circuit being connected between said first electrode and a point of substantially fixed potential, a resonant output circuit tuned to a predetermined intermediate frequency and connected effectively between said second electrode and said point of fixed potential, a conductor providing inductance connected between said second electrode and said output circuit, an oscillation generator tunable within a second predetermined portion of said U. H. F. spectrum for impressing an unmodulated carrier wave on said conductor, a capacitor, a resistor and at least one lead connected in series between said second electrode and said point of fixed potential, said lead providing inductance, whereby the combined impedance of said capacitor, resistor and lead varies within narrow limits over said second predetermined U. H. F. portion and effectively shunts the unmodulated carrier wave energy impressed on said crystal mixer to equalize said energy, said combined impedance being small compared to the impedance which said crystal mixer presents to said unmodulated carrier wave, said input circuit including a first inductor directly connected between said first electrode and said point of fixed potential, and a second inductor connected between said conductor and said point of fixed potential, said inductors providing a return path for the direct current flowing through said crystal mixer.

WEN YUAN PAN.

References Cited in the file of this patent

UNITED STATES PATENTS

| Number | Name | Date |
|---|---|---|
| 2,239,560 | Herold | Apr. 22, 1941 |
| 2,242,791 | Ohl | May 20, 1941 |